(12) United States Patent
Yoon

(10) Patent No.: US 11,750,181 B2
(45) Date of Patent: Sep. 5, 2023

(54) DIGITAL PHASE INTERPOLATOR, CLOCK SIGNAL GENERATOR, AND VOLATILE MEMORY DEVICE INCLUDING THE CLOCK SIGNAL GENERATOR

(71) Applicant: SAMSUNG ELECTRONICS CO., LTD., Suwon-si (KR)

(72) Inventor: Junsub Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 36 days.

(21) Appl. No.: 17/575,020

(22) Filed: Jan. 13, 2022

(65) Prior Publication Data

US 2022/0393673 A1   Dec. 8, 2022

(30) Foreign Application Priority Data

Jun. 3, 2021  (KR) .................. 10-2021-0072399

(51) Int. Cl.
| | | |
|---|---|---|
| *G11C 11/4093* | (2006.01) | |
| *G11C 11/4076* | (2006.01) | |
| *H03K 5/133* | (2014.01) | |
| *H03K 5/00* | (2006.01) | |

(52) U.S. Cl.
CPC .......... *H03K 5/133* (2013.01); *G11C 11/4076* (2013.01); *G11C 11/4093* (2013.01); *H03K 2005/00052* (2013.01)

(58) Field of Classification Search
CPC ................. G11C 11/4076; G11C 11/4093
USPC .................... 365/194, 233, 189.05
See application file for complete search history.

(56) References Cited

U.S. PATENT DOCUMENTS

| | | | |
|---|---|---|---|
| 6,525,584 B2 | 2/2003 | Seo et al. | |
| 7,379,382 B2 * | 5/2008 | LaBerge | ............... H03K 5/06 365/189.05 |
| 7,772,907 B2 | 8/2010 | Kim et al. | |
| 7,912,167 B2 | 3/2011 | Saeki | |
| 8,004,328 B2 | 8/2011 | Kim et al. | |
| 8,373,475 B2 | 2/2013 | Na et al. | |

(Continued)

FOREIGN PATENT DOCUMENTS

| | | |
|---|---|---|
| KR | 10-2003-0003903 A | 1/2003 |
| KR | 10-2009-0040725 A | 4/2009 |

(Continued)

*Primary Examiner* — Connie C Yoha
(74) *Attorney, Agent, or Firm* — Lee IP Law, P.C.

(57) ABSTRACT

Provided are a digital phase interpolator, a clock signal generator, and a volatile memory device including the clock signal generator. The clock signal generator includes an internal signal generator configured to generate a first internal signal and a second internal signal, which mutually have a phase difference, based on an external clock signal, a first phase interpolator configured to interpolate the first internal signal with the second internal signal in response to a first control signal and generate a first interpolation signal, a second phase interpolator configured to interpolate the first internal signal with the second internal signal in response to a second control signal and generate a second interpolation signal, and a selector configured to select any one of the first interpolation signal and the second interpolation signal in response to a selection signal and output the selected interpolation signal as an internal clock signal.

20 Claims, 10 Drawing Sheets

(56) References Cited

U.S. PATENT DOCUMENTS

| | | | |
|---|---|---|---|
| 8,384,458 B1 | 2/2013 | Huang | |
| 8,861,246 B2* | 10/2014 | King | G11C 8/06 |
| | | | 365/189.05 |
| 8,908,804 B2 | 12/2014 | Kuttner | |
| 9,735,788 B2 | 8/2017 | Lee et al. | |
| 10,659,064 B1 | 5/2020 | Yoo et al. | |
| 2005/0024117 A1 | 2/2005 | Kubo et al. | |
| 2012/0188835 A1* | 7/2012 | Shaeffer | G11C 7/1063 |
| | | | 365/194 |

FOREIGN PATENT DOCUMENTS

| | | |
|---|---|---|
| KR | 10-2014-0130064 A | 11/2014 |
| KR | 10-1727719 B1 | 4/2017 |

* cited by examiner

DIGITAL PHASE INTERPOLATOR, CLOCK SIGNAL GENERATOR, AND VOLATILE MEMORY DEVICE INCLUDING THE CLOCK SIGNAL GENERATOR

CROSS-REFERENCE TO RELATED APPLICATION

This application is based on and claims priority under 35 U.S.C. § 119 to Korean Patent Application No. 10-2021-0072399, filed on Jun. 3, 2021, in the Korean Intellectual Property Office, the disclosure of which is incorporated by reference herein in its entirety.

BACKGROUND

1. Field

Embodiments relate to an electronic device, and more particularly, to a digital phase interpolator, a clock signal generator, and a volatile memory device including the clock signal generator.

2. Description of the Related Art

In general, a circuit configured to adjust fine delay times of input/output (I/O) circuits for various purposes may be used for an internal circuit of a semiconductor device.

SUMMARY

Embodiments are directed to a clock signal generator configured to receive an external clock signal and generate an internal clock signal. The clock signal generator includes an internal signal generator, a first phase interpolator, a second phase interpolator, and a selector. The internal signal generator generates a first internal signal and a second internal signal, based on the external clock signal. The first internal signal has a predetermined phase difference relative to the second internal signal. The first phase interpolator interpolates the first internal signal with the second internal signal in response to a first control signal and generates a first interpolation signal. The first interpolation signal is a signal that is delayed by 2N times a preset delay step with respect to the first internal signal. Here, N is an integer greater than or equal to 0. The second phase interpolator interpolates the first internal signal with the second internal signal in response to a second control signal and generates a second interpolation signal. The second interpolation signal is a signal that is delayed by (2N+1) times the preset delay step with respect to the first internal signal. The selector selects any one of the first interpolation signal and the second interpolation signal in response to a selection signal and outputs the selected interpolation signal as the internal clock signal.

Embodiments are directed to a digital phase interpolator configured to receive a first internal signal and a second internal signal and generate an internal clock signal. The digital phase interpolator includes a first phase interpolator, a second phase interpolator, a selector, and a flip-flop. The first phase interpolator includes a first inverter group and a second inverter group. The first inverter group is connected between a first node to which the second internal signal is applied and a second node. The second inverter group is connected between a third node to which the first internal signal is applied and the second node. The second phase interpolator includes a third inverter group and a fourth inverter group. The third inverter group is connected between the third node and a fourth node. The fourth inverter group is connected between the first node and the fourth node. The selector includes a first input terminal connected to the second node, a second input terminal connected to the fourth node, a third input terminal to which a selection signal is applied, and an output terminal connected to a fifth node to which the internal clock signal is transmitted. The flip-flop includes a data input terminal, a clock input terminal connected to the fifth node, and an output terminal configured to output the selection signal. Each of the first to fourth inverter groups includes at least one inverter and a half-strength inverter having a smaller size than the at least one inverter.

Embodiments are directed to a volatile memory device including a memory cell array including a plurality of memory cells, a clock signal generator configured to receive an external clock signal and generate an internal clock signal, a data input/output (I/O) circuit configured to transmit data sensed from the memory cell array in response to the internal clock signal, and a control logic circuit configured to output first to third control signals to the clock signal generator. The clock signal generator includes an internal signal generator, a first phase interpolator, a second phase interpolator, a selector, and a flip-flop. The internal signal generator generates a first internal signal and a second internal signal, based on the external clock signal. The first internal signal has a predetermined phase difference relative to the second internal signal. The first phase interpolator interpolates the first internal signal with the second internal signal in response to the first control signal, from among the first to third control signals, and generates a first interpolation signal. The second phase interpolator interpolates the first internal signal with the second internal signal in response to the second control signal, from among the first to third control signals, and generates a second interpolation signal. The selector selects any one of the first interpolation signal and the second interpolation signal in response to a selection signal and outputs the selected interpolation signal as the internal clock signal. The flip-flop receives an inverted signal obtained by inverting the selected interpolation signal, as a clock input signal, receives the third control signal, from among the first to third control signals, as a data input signal, and generates the selection signal in response to an edge of the inverted signal.

BRIEF DESCRIPTION OF THE DRAWINGS

Features will become apparent to those of skill in the art by describing in detail example embodiments with reference to the attached drawings in which.

DETAILED DESCRIPTION

Figure 1:
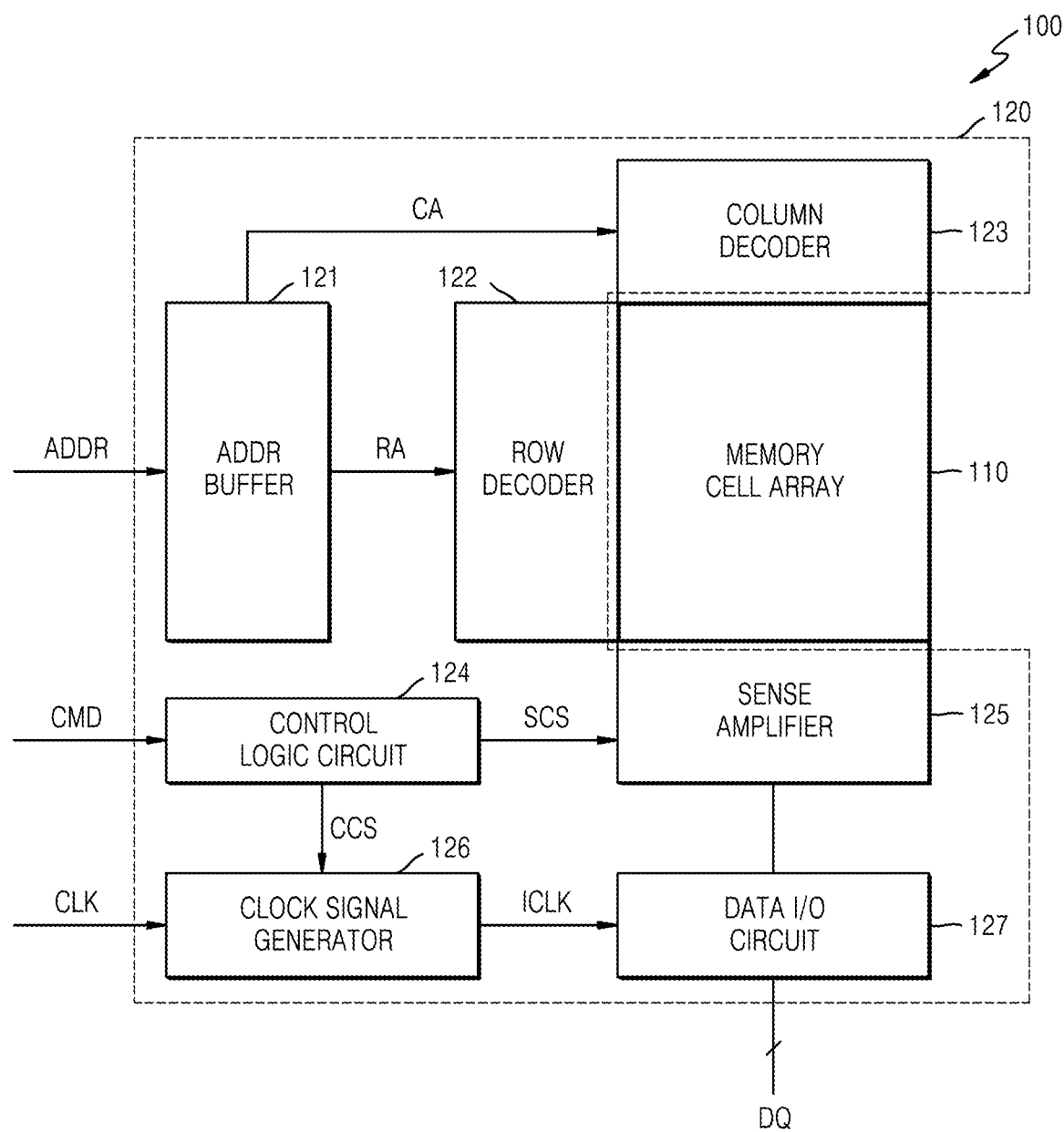
FIG. 1 is a diagram of a volatile memory device according to an example embodiment.

FIG. 1 is a diagram of a volatile memory device 100 according to an example embodiment.

Referring to FIG. 1, the volatile memory device 100 may be a storage device that is based on a semiconductor device. As an example, the volatile memory device 100 may be a volatile memory, such as dynamic random access memory (DRAM), synchronous DRAM (SDRAM), double data rate (DDR) SDRAM, low-power DDR (LPDDR) SDRAM, graphics DDR (GDDR) SDRAM, DDR2 SDRAM, DDR3 SDRAM, DDR4 SDRAM, and thyristor RAM (TRAM).

The volatile memory device 100 may receive supply voltages from the outside to operate. The volatile memory device 100 may receive a command CMD, an address ADDR, and a control signal from an external device (e.g., a central processing unit (CPU) or a memory controller), and may input or output data through data pads DQ.

The volatile memory device 100 may include a memory cell array 110 and a peripheral circuit 120.

The memory cell array 110 may include a plurality of memory cells arranged as a matrix type in rows and columns. The memory cell array 110 may include a plurality of word lines and a plurality of bit lines, which are connected to the memory cells. The plurality of word lines may be connected to the rows of the memory cells. The plurality of bit lines may be connected to the columns of the memory cells.

The peripheral circuit 120 may include an address buffer 121, a row decoder 122, a column decoder 123, control logic circuit 124, a sense amplifier 125, a clock signal generator 126, and a data input/output (I/O) circuit 127.

The address buffer 121 may receive the address ADDR from the CPU or the memory controller. The address ADDR may include a row address RA, for addressing a row of the memory cell array 110, and a column address CA, for addressing a column of the memory cell array 110. The command CMD and the address ADDR may be provided through a command address bus to the volatile memory device 100. The command CMD or the address ADDR may be loaded in the command address bus in a temporal sequence. The address buffer 121 may transmit the row address RA to the row decoder 122, and may transmit the column address CA to the column decoder 123.

The row decoder 122 may select any one word line of the plurality of word lines connected to the memory cell array 110. The row decoder 122 may decode the row address RA received from the address buffer 121, may select any one word line corresponding to the row address RA, and may enable the selected word line.

The column decoder 123 may select predetermined bit lines of the plurality of bit lines of the memory cell array 110. The column decoder 123 may decode the column address CA received from the address buffer 121, and may select bit lines corresponding to the column address CA.

The sense amplifier 125 may be connected to the bit lines of the memory cell array 110. The sense amplifier 125 may sense voltage differences of the bit lines, may amplify the voltage differences, and may output the amplified voltage differences. The bit lines of which the voltage differences are sensed and amplified by the sense amplifier 125 may be selected by an I/O gating circuit. The I/O gating circuit may include read data latches, configured to store data of the selected bit lines, and a write driver, configured to write data to the memory cell array 110. The data stored in the read data latches may be provided through the data I/O circuit 127 to the data pads DQ. Write data provided through the data pads DQ to the data I/O circuit 127 may be written to the memory cell array 110 by the write driver.

The control logic circuit 124 may provide, to the sense amplifier 125, a sense control signal SCS for controlling the sense amplifier 125. The control logic circuit 124 may include a sensing-matching control circuit configured to constantly control sensing operations of bit line sense amplifiers in the sense amplifier 125. The sensing-matching control circuit may output first and/or second sensing driving control signals by constantly controlling voltage levels of voltages supplied to a first sensing driving voltage line and a second sensing driving voltage line connected to the bit line sense amplifiers. In response to the first and/or second sensing driving control signals of the sensing-matching control circuit, all the bit line sense amplifiers of the sense amplifier 125 may be driven with the same first and/or second sensing driving voltages, and thus, sensing operations of the bit line sense amplifiers may be constantly controlled.

The control logic circuit 124 may provide, to the clock signal generator 126, a clock control signal CCS for controlling the clock signal generator 126. The clock control signal CCS may include first to third control signals. The first to third control signals are described below with reference to FIG. 4A. The clock control signal CCS may include first to fifth control signals. The fourth and fifth control signals are described below with reference to FIG. 5A.

The control logic circuit 124 may include a command decoder. The command decoder may decode a row address strobe signal, a column address strobe signal, a chip selection signal, and a write enable signal, which are received from the CPU or the memory controller, and thus, the control logic circuit 124 may generate control signals corresponding to the command CMD. The command CMD may include an active command, a read command, a write command, and a precharge command.

The clock signal generator 126 may receive an external clock signal CLK, and may generate an internal clock signal ICLK, based on the received external clock signal CLK, in response to the clock control signal CCS. The clock signal generator 126 may provide the internal clock signal ICLK to the data I/O circuit 127.

The data I/O circuit 127 may transmit data sensed by the memory cell array 110 in response to the internal clock signal ICLK. The data sensed by the memory cell array 110 may be read data. The data I/O circuit 127 may provide write data to the memory cell array 110 in response to the internal clock signal ICLK.

Figure 2:
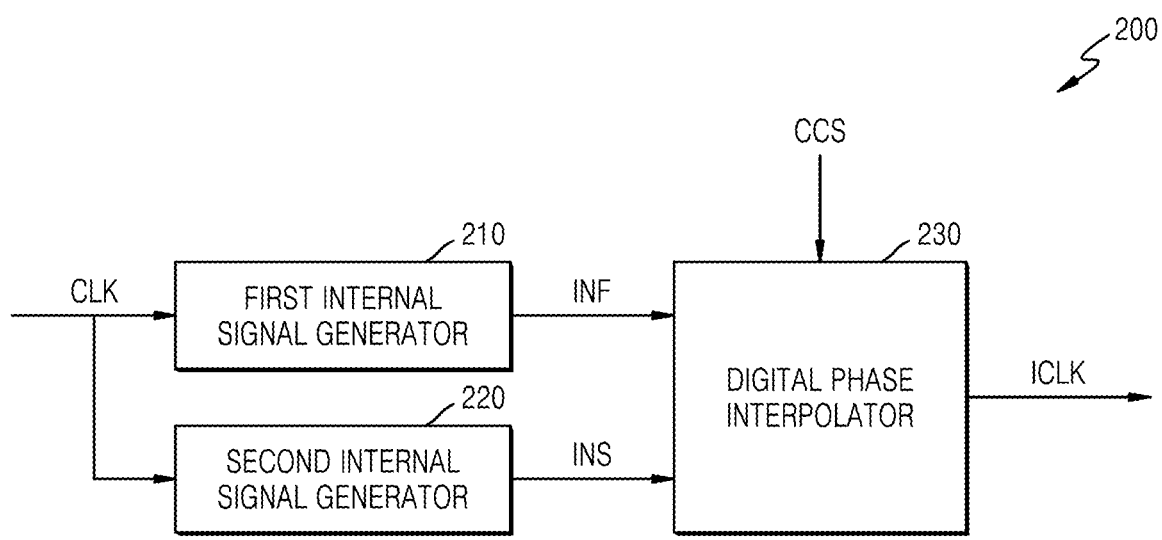
FIG. 2 is a diagram of a clock signal generator according to an example embodiment.

FIG. 2 is a diagram of a clock signal generator 200 according to an example embodiment. The clock signal generator 200 may be implemented as the clock signal generator 126 shown in FIG. 1.

Referring to FIG. 2, the clock signal generator 200 may include a first internal signal generator 210, a second internal signal generator 220, and a digital phase interpolator 230.

The first internal signal generator 210 may receive the external clock signal CLK, and may generate a first internal signal INF based on the received external clock signal CLK.

The second internal signal generator 220 may also receive the external clock signal CLK, and may generate a second internal signal INS based the received external clock signal CLK.

The first internal signal INF may have a predetermined phase difference relative to the second internal signal INS. The first internal signal INF may lead the second internal signal INS. In another implementation, the first internal signal INF may lag the second internal signal INS. The first internal signal INF and the second internal signal INS may be clock signals. The first internal signal INF and the second internal signal INS may be square wave signals.

The first internal signal generator 210 and the second internal signal generator 220 may be implemented as an internal signal generator having a single configuration. The internal signal generator having a single configuration may generate the first internal signal INF and the second internal signal INS, based on the external clock signal CLK.

The digital phase interpolator 230 may receive the first internal signal INF and the second internal signal INS. The digital phase interpolator 230 may generate an internal clock signal ICLK, based on the first internal clock INF and the second internal signal INS, in response to the clock control signal CCS.

The internal clock signal ICLK may be an interpolated signal between the first internal signal INF and the second internal signal INS. The interpolated signal may be a signal that is delayed with respect to the first internal signal INF (or the second internal signal INS). For example, the interpolated signal may be delayed by N times a preset delay step (N is an integer greater than or equal to 0, e.g., an integer of 1 or more). The delay step may refer to a unit obtained by equally dividing a phase difference between the first internal signal INF and the second internal signal INS.

Figure 3A:
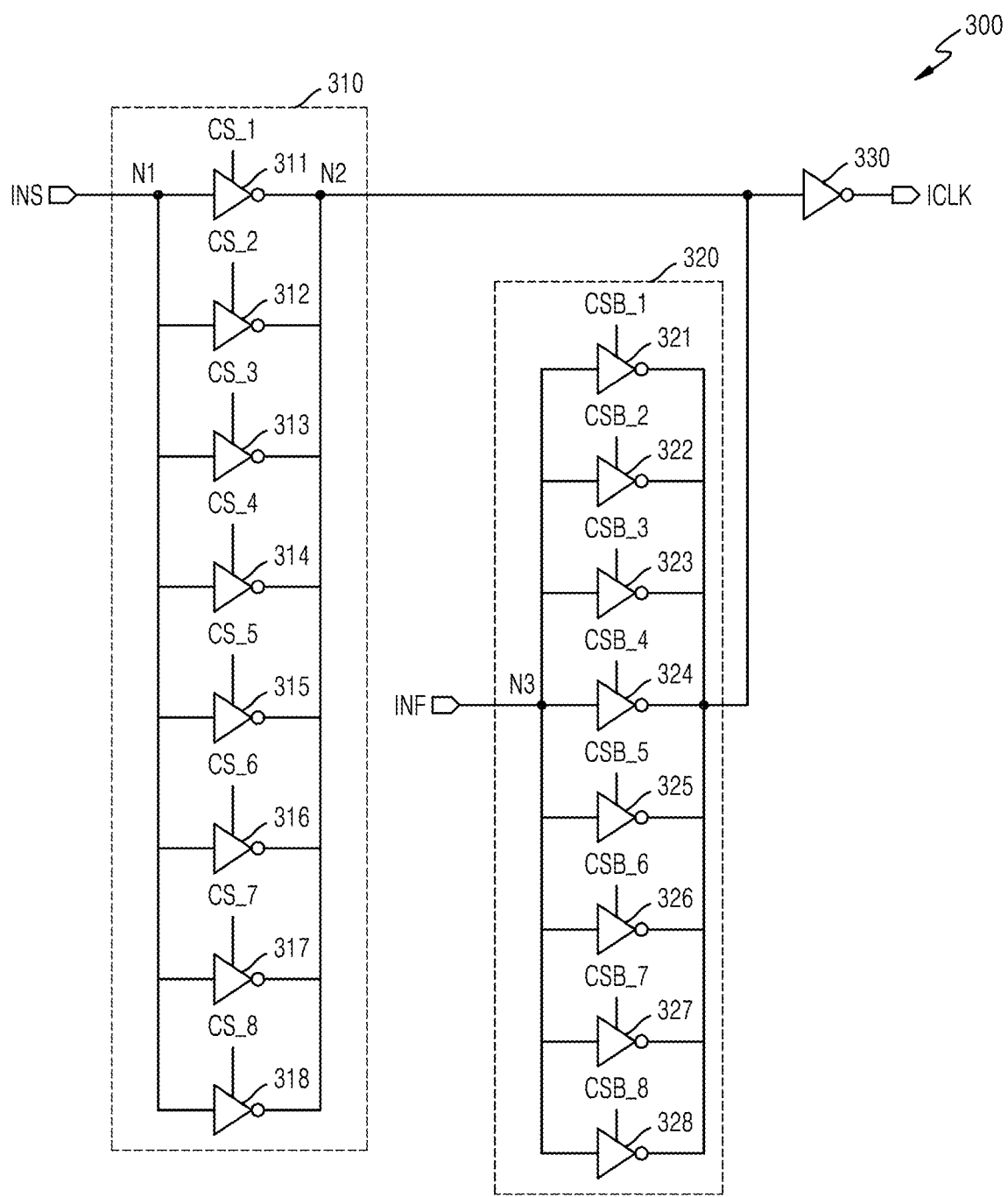
FIGS. 3A and 3B are diagrams of a reference digital phase interpolator.
Figure 3B:
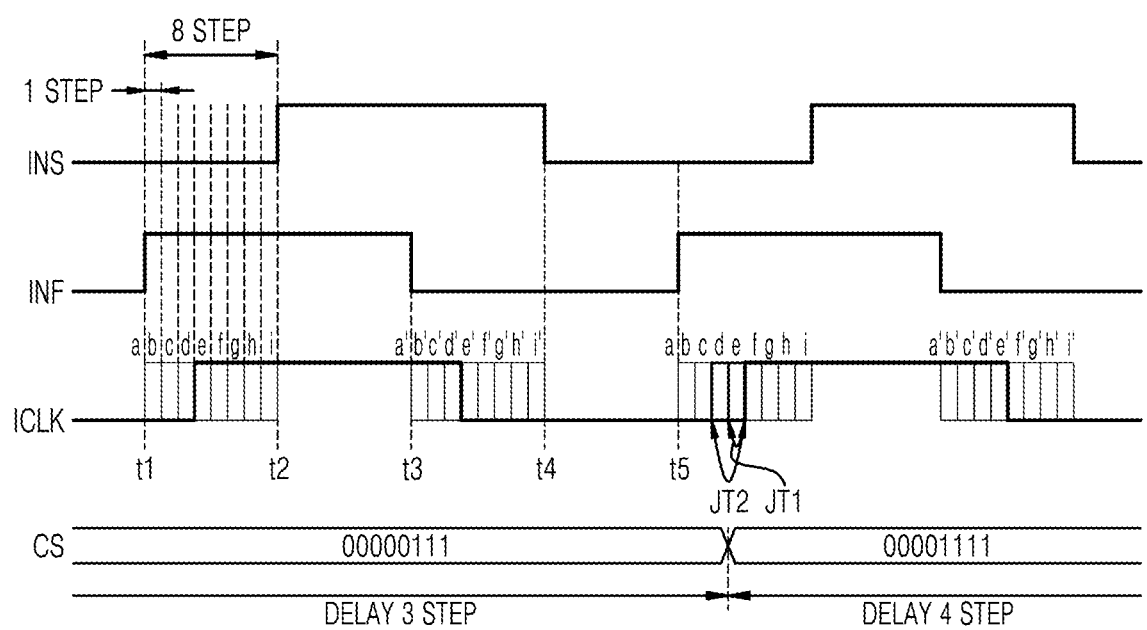

For reference, an example of a general operation of generating the internal clock signal ICLK will now be provided in connection with FIGS. 3A and 3B.

FIGS. 3A and 3B are diagrams of a reference digital phase interpolator 300. Specifically, FIG. 3A is a schematic circuit diagram of the reference digital phase interpolator 300, and FIG. 3B is a schematic diagram of signals input to and output from the reference digital phase interpolator 300.

Referring to FIG. 3A, the reference digital phase interpolator 300 may include a first inverter group 310, a second inverter group 320, and a third inverter 330.

The first inverter group 310 may be connected between a first node N1 and a second node N2. The second internal signal INS may be applied to the first node N1.

The first inverter group 310 may include at least one first inverter. For example, the first inverter group 310 may include eight first inverters 311, 312, 313, 314, 315, 316, 317, and 318, although the number may be varied. Hereinafter, for brevity, it is assumed that the number of first inverters included in the first inverter group 310 is 8.

A control signal may be transmitted to each of the first inverters included in the first inverter group 310. For example, the eight first inverters 311, 312, 313, 314, 315, 316, 317, and 318 included in the first inverter group 310 may receive eight control signals CS_1, CS_2, CS_3, CS_4, CS_5, CS_6, CS_7, and CS_8, respectively. Each of the eight control signals CS_1, CS_2, CS_3, CS_4, CS_5, CS_6, CS_7, and CS_8 may be a signal for enabling the respective first inverter. Each of the eight control signals CS_1, CS_2, CS_3, CS_4, CS_5, CS_6, CS_7, and CS_8 may have a first logic level or a second logic level. The first logic level may be lower than the second logic level. For example, the first logic level may be a logic low level (or 0) and a logic level that turns off the first inverter, while the second logic level may be a logic high level (or 1) and a logic level that turns on the first inverter.

The first inverters 311, 312, 313, 314, 315, 316, 317, and 318 may be connected in parallel. Each of the first inverters 311, 312, 313, 314, 315, 316, 317, and 318 may include a first input terminal connected to the first node N1, a second input terminal configured to receive a control signal, and an output terminal connected to the second node N2. A first inverter that is turned on may invert the second internal signal INS, and may transmit the inverted second internal signal to the second node N2.

The second inverter group 320 may be connected between a third node N3 and the second node N2. The first internal signal INF may be applied to the third node N3.

The second inverter group 320 may include at least one second inverter. The number of second inverters may be equal to the number of first inverters. For example, the second inverter group 320 may include eight second inverters 321, 322, 323, 324, 325, 326, 327, and 328, although the number may be varied. Hereinafter, the number of second inverters is also assumed to be 8.

An inverted control signal may be transmitted to each of the second inverters included in the second inverter group 320. The inverted control signal may enable each second inverter, and may be an inverted (or bar) signal of the control signal transmitted to the first inverter. For example, from among eight inverted control signals CSB_1, CSB_2, CSB_3, CSB_4, CSB_5, CSB_6, CSB_7, and CSB_8, any one inverted control signal (e.g., CSB_1) may be an inverted signal of any one control signal (e.g., CS_1) of the eight control signals CS_1, CS_2, CS_3, CS_4, CS_5, CS_6, CS_7, and CS_8. When the control signal CS_1 is at the first logic level, the inverted control signal CSB_1 may be at the second logic level. The eight inverted control signals CSB_1, CSB_2, CSB_3, CSB_4, CSB_5, CSB_6, CSB_7, and CSB_8 may be respectively transmitted to the eight second inverters 321, 322, 323, 324, 325, 326, 327, and 328.

The second inverters 321, 322, 323, 324, 325, 326, 327, and 328 may also be connected in parallel. Each of the second inverters 321, 322, 323, 324, 325, 326, 327, and 328 may include a first input terminal connected to the third node N3, a second input terminal configured to receive an inverted control signal, and an output terminal connected to the second node N2. A second inverter that is turned on may invert the first internal signal INF, and may transmit the inverted first internal signal to the second node N2.

By transmitting the inverted first internal signal and the inverted second internal signal to the second node N2, the inverted first internal signal may be interpolated with the inverted second internal signal. A signal obtained by interpolating the inverted first internal signal with the inverted second internal signal may be referred to as an interpolation signal.

The third inverter 330 may invert the interpolation signal generated at the second node N2. The third inverter 330 may output the inverted interpolation signal as the internal clock signal ICLK.

Referring to FIG. 3B, each of the first internal signal INF and the second internal signal INS may be a square wave signal having a constant period.

The first internal signal INF may rise at a first time point t1 and fall at a third time point t3. The period of the first internal signal INF may correspond to a time difference between the first time point t1 and a fifth time point t5.

The second internal signal INS may rise at a second time point t2 and fall at a fourth time point t4. The period of the second internal signal INS may be equal to the period of the first internal signal INF.

A phase difference between the first internal signal INF and the second internal signal INS may correspond to a difference between the first time point t1 and the second time point t2.

As described above, the delay step may refer to a unit obtained by equally dividing the phase difference between the first internal signal INF and the second internal signal INS. Herein, the delay step may be denoted "1 STEP". Referring to FIGS. 3A and 3B, the number of delay steps 1 STEP may correspond to the number of inverters included in an inverter group. Thus, when the number of inverters included in the inverter group is 8, the number of delay steps 1 STEP may be 8.

The internal clock signal ICLK may have a number of phase differences (relative to the first internal signal INF) that is equal to one (1) plus the number of delay steps 1 STEP. When the number of inverters included in the inverter group is 8, the internal clock signal ICLK may have 9 phase differences relative to the first internal signal INF, wherein the number of phase differences includes a phase difference of zero (0). Thus, the internal clock signal ICLK may be varied from the first internal signal INF to the second internal signal INS.

For example, when the internal clock signal ICLK is the same signal as the first internal signal INF, the internal clock signal ICLK may have a first phase difference a, wherein the first phase difference a may be 0.

As another example, when the internal clock signal ICLK is a signal that is delayed by the delay step 1 STEP with respect to the first internal signal INF, the internal clock signal ICLK may have a second phase difference b.

In another example, when the internal clock signal ICLK is a signal that is delayed by eight delay steps 1 STEP with respect to the first internal signal INF, the internal clock signal ICLK may have a ninth phase difference 'i', and the internal clock signal ICLK may be the same as the second internal signal INS.

A control signal CS may include the eight control signals CS_1, CS_2, CS_3, CS_4, CS_5, CS_6, CS_7, and CS_8, i.e., may be expressed as eight bit values. For example, the control signal CS may be expressed as "00000000," "00000001," "00000011," "00000111," "00001111," "00011111," "00111111," "01111111," or "11111111" corresponding to nine phase differences. That is, "00000000" to "11111111" may be values of the control signal CS for allowing the internal clock signal ICLK to have the first to ninth phase differences 'a' to 'i', respectively.

For example, the control signal CS may correspond to "00000000" so that the internal clock signal ICLK may have the first phase difference 'a'.

In another example, the control signal CS may correspond to "00000001" so that the internal clock signal ICLK may have the second phase difference 'b'.

Each bit in the control signal CS may correspond to a logic level of each of the eight control signals CS_1, CS_2, CS_3, CS_4, CS_5, CS_6, CS_7, and CS_8. For example, when the control signal CS is "00000000", the eight control signals CS_1, CS_2, CS_3, CS_4, CS_5, CS_6, CS_7, and CS_8 may be at the first logic level. In another example, when the control signal CS is "00000001," any one control signal (e.g., CS_1) from among the eight control signals CS_1, CS_2, CS_3, CS_4, CS_5, CS_6, CS_7, and CS_8 may be at the second logic level, while the remaining seven control signals (e.g., CS_2, CS_3, CS_4, CS_5, CS_6, CS_7, and CS_8) may be at the first logic level. That is, as the phase difference of the internal clock signal ICLK increases from the first phase difference 'a' to the ninth phase difference 'i', a control signal corresponding to the phase difference of the internal clock signal ICLK, from among the eight control signals CS_1, CS_2, CS_3, CS_4, CS_5, CS_6, CS_7, and CS_8, may be changed from "0" to "1."

It will be understood that when the control signal CS is changed from "0" to "1," the first inverter that has received the control signal CS ("1") may be turned on, while the second inverter that has received an inverted signal ("0") of the control signal CS may be turned off.

In an example taken with reference to FIGS. 1, 3A, and 3B, the control logic circuit 124 may generate a control signal CS expressed as "00000111" such that the internal clock signal ICLK has the fourth phase difference 'd' to the first internal signal INF. From among the eight control signals CS_1, CS_2, CS_3, CS_4, CS_5, CS_6, CS_7, and CS_8, three control signals (e.g., CS_1, CS_2, and CS_3) may be at the second logic level, while five control signals (e.g., CS_4, CS_5, CS_6, CS_7, and CS_8) may be at the first logic level. Three first inverters (e.g., 311, 312, and 313) included in the first inverter group 310 may be turned on, while five second inverters (e.g., 324, 325, 326, and 327) included in the second inverter group 320 may be turned on. At the second node N2, the first internal signal INF may be interpolated with the second internal signal INS, and the internal clock signal ICLK having the fourth phase difference 'd' shown in FIG. 3B may be output during a three-delay step period DELAY 3 STEP.

In another example taken with reference to FIGS. 1, 3A, and 3B, the control logic circuit 124 may generate a control signal CS expressed as "00001111" such that a logic level of any one control signal (e.g., CS_4) from among the five control signals CS_4, CS_5, CS_6, CS_7, and CS_8 may be changed from the first logic level to the second logic level, and the internal clock signal ICLK having a fifth phase difference 'e' (which is delayed by one more step than the fourth phase difference 'd' relative to the first internal signal INF) may be output during a four-delay step period DELAY 4 STEP.

In the above-described operation of the reference digital phase interpolator 300, when the internal clock signal ICLK has a new phase difference, jitter JT may occur. For example, when the four-delay step period DELAY 4 STEP starts, the internal clock signal ICLK may temporarily have still the fourth phase difference 'd' due to first jitter JT1, or the internal clock signal ICLK may temporarily have a third phase difference 'c' due to second jitter JT2, or the internal clock signal ICLK may have the sixth phase difference 'f' due to third jitter (not shown in FIG. 3B).

In the above-described operation of the reference digital phase interpolator 300, when the internal clock signal ICLK does not have an intended phase difference due to jitter (e.g., the second jitter JT2), the reliability of the internal clock signal ICLK may be reduced.

Figure 4A:
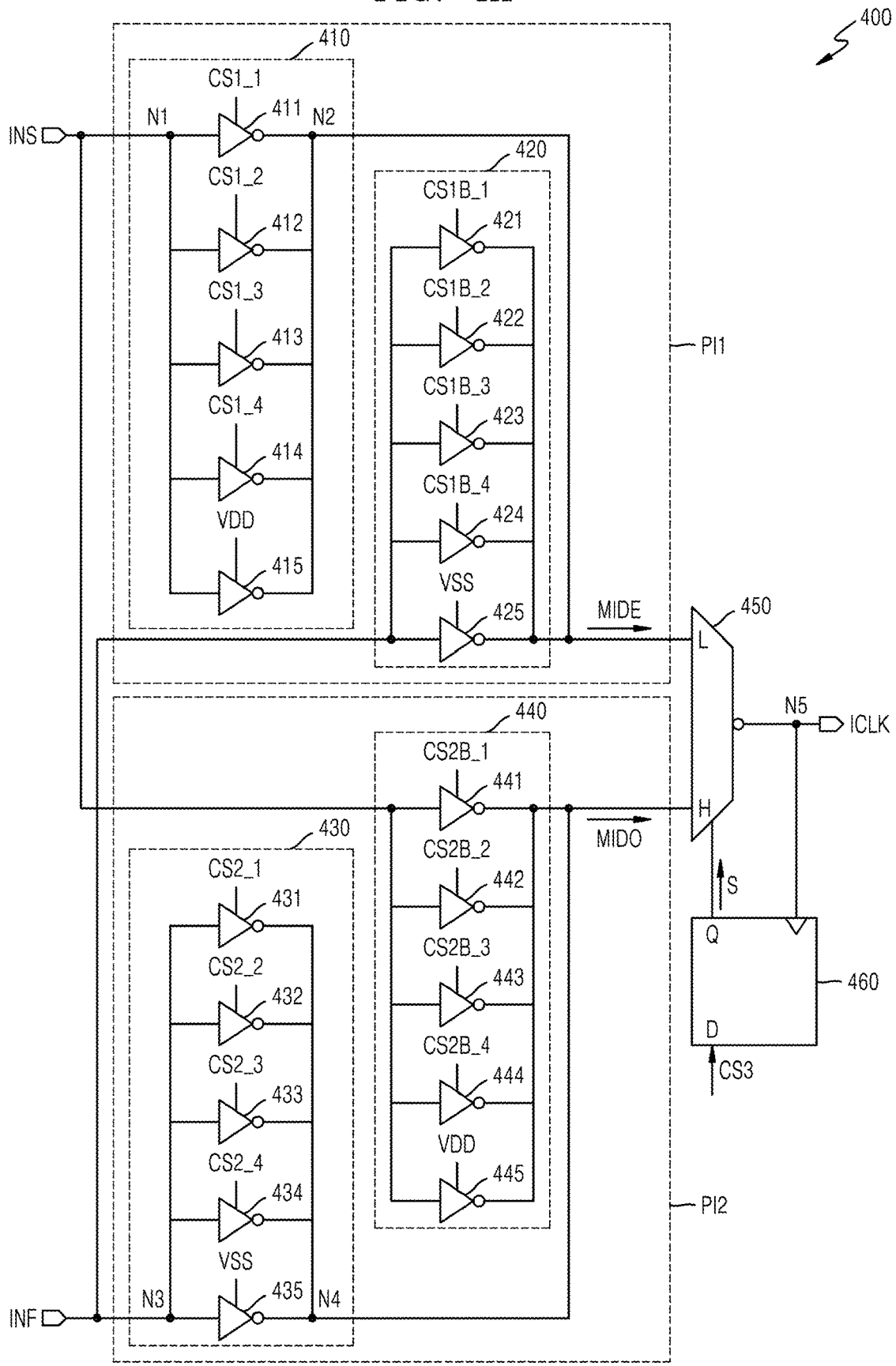
FIGS. 4A and 4B are diagrams of a digital phase interpolator according to an example embodiment.
Figure 4B:
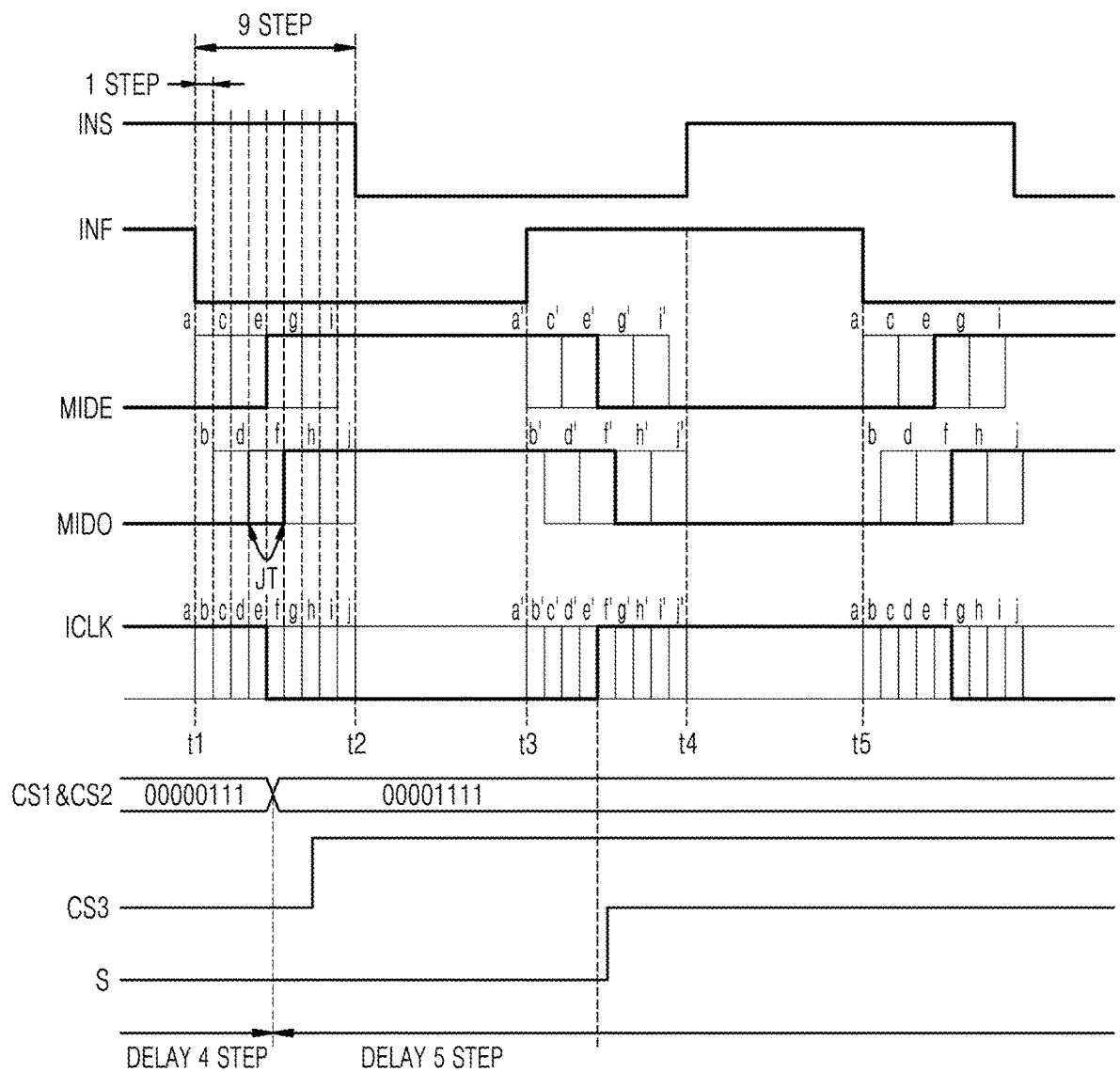

FIGS. 4A and 4B are diagrams of a digital phase interpolator 400 according to an example embodiment.

Referring to FIG. 4A, the digital phase interpolator 400 according to the present example embodiment may include a first phase interpolator PI1 and a second phase interpolator PI2. Operations of the first phase interpolator PI1 and the second phase interpolator PI2 are described below, and may respectively be similar to operations of the first inverter group 310 and the second inverter group 320 described above for the reference digital phase interpolator 300 and FIGS. 3A and 3B.

Referring further to FIG. 4A, the digital phase interpolator 400 according to the present example embodiment may also include a selector 450 and a flip-flop 460.

The first phase interpolator PI1 may interpolate the first internal signal INF with the second internal signal INS, and may generate a first interpolation signal MIDE in response to first control signals CS1_1 to CS1_4. The first phase interpolator PI1 may transmit the first interpolation signal MIDE to a first input terminal of the selector 450. The second phase interpolator PI2 may interpolate the first internal signal INF with the second internal signal INS, and may generate a second interpolation signal MIDO in response to second control signals CS2_1 to CS2_4. The second phase interpolator PI2 may transmit the second interpolation signal MIDO to a second input terminal of the selector 450.

The first phase interpolator PI1 will now be described.

The first phase interpolator PI1 may include a first inverter group 410 and a second inverter group 420. The first inverter group 410 may be connected between a first node N1, which receives the second internal signal INS, and a second node N2. The second inverter group 420 may be connected between a third node N3, which receives the first internal signal INF, and the second node N2.

The first inverter group 410 may include at least one first inverter (e.g., four first inverters 411, 412, 413, and 414), similarly to the first inverter group 310 described above with reference to FIG. 3A, and a first half-strength inverter 415 connected in parallel to the four first inverters 411, 412, 413, and 414. The number of first inverters may be varied. The number of first inverters included in the first inverter group 410 may be half the number of first inverters included in the first inverter group 310. Hereinafter, for brevity, the number of first inverters included in the first inverter group 410 is assumed to be 4.

The four first inverters 411, 412, 413, and 414 included in the first inverter group 410 may receive four first control signals CS1_1, CS1_2, CS1_3, and CS1_4, respectively. The four first control signals CS1_1, CS1_2, CS1_3, and CS1_4 may correspond to odd-numbered control signals CS_1, CS_3, CS_5, and CS_7 from among eight control signals CS_1, CS_2, CS_3, CS_4, CS_5, CS_6, CS_7, and CS_8. The four first inverters 411, 412, 413, and 414 may invert the second internal signal INS in response to the four first control signals CS1_1, CS1_2, CS1_3, and CS1_4, respectively.

In the first inverter group 410, the first half-strength inverter 415 may be an inverter having a smaller driving strength than a first inverter (e.g., the first inverter 411). The first half-strength inverter 415 may include a first input terminal connected to the first node N1, a second input terminal configured to receive a first supply voltage VDD, and an output terminal connected to the second node N2. A voltage level of the first supply voltage VDD may be a level at which the half-strength inverter may be turned on. The first half-strength inverter 415 that is turned on may invert the second internal signal INS.

The second inverter group 420 may include at least one second inverter (e.g., four second inverters 421, 422, 423, and 424), similarly to the second inverter group 320 described with reference to FIG. 3A, and a second half-strength inverter 425 connected in parallel to the four second inverters 421, 422, 423, and 424. The number of second inverters included in the second inverter group 420 may be equal to the number of first inverters included in the first inverter group 410.

The four second inverters 421, 422, 423, and 424 included in the second inverter group 420 may receive four first inverted control signals CS1B_1, CS1B_2, CS1B_3, and CS1B_4, respectively. The first inverted control signal CS1B_1 may be an inverted signal of the first control signal CS1_1, and so on.

The four second inverters 421, 422, 423, and 424 may invert the first internal signal INF in response to the four first inverted control signals CS1B_1, CS1B_2, CS1B_3, and CS1B_4, respectively.

In the second inverter group 420, the second half-strength inverter 425 may include an input terminal configured to receive a second supply voltage VSS, another input terminal connected to the third node N3, and an output terminal connected to the second node N2. A voltage level of the second supply voltage VS S may be a level capable of turning off a half-strength inverter. A voltage level of the first supply voltage VDD may be lower than the voltage level of the second supply voltage VSS.

The second phase interpolator PI2 will now be described.

As described above, the second phase interpolator PI2 may interpolate the first internal signal INF with the second internal signal INS, may generate the second interpolation signal MIDO in response to the second control signals CS2_1 to CS2_4, and may transmit the second interpolation signal MIDO to the second input terminal of the selector 450.

The second phase interpolator PI2 may include a third inverter group 430 and a fourth inverter group 440. The third inverter group 430 may be connected between the third node N3 and a fourth node N4. The fourth inverter group 440 may be connected between the first node N1 and the fourth node N4.

The third inverter group 430 may include at least one third inverter (e.g., four third inverters 431, 432, 433, 434) and a third half-strength inverter 435 connected in parallel to the four third inverters 431, 432, 433, and 434. The number of third inverters may be equal to the number of first inverters included in the first inverter group 410.

The four third inverters 431, 432, 433, 434 included in the third inverter group 430 may invert the first internal signal INF in response to four second control signals CS2_1, CS2_2, CS2_3, and CS2_4, respectively. The four second control signals CS2_1, CS2_2, CS2_3, and CS2_4 may correspond to even-numbered control signals CS_2, CS_4, CS_6, and CS_8 from among the eight control signals CS_1, CS_2, CS_3, CS_4, CS_5, CS_6, CS_7, and CS_8.

The third half-strength inverter 435 may include an input terminal configured to receive the second supply voltage VSS, another input terminal connected to the third node N3, and an output terminal connected to the fourth node N4.

The fourth inverter group 440 may include at least one fourth inverter (e.g., four fourth inverters 441, 442, 443, and 444) and a fourth half-strength inverter 445 connected in parallel to the four fourth inverters 441, 442, 443, and 444. The number of the fourth inverters may be equal to the number of third inverters included in the third inverter group 430.

The four fourth inverters 441, 442, 443, and 444 may invert the second internal signal INS in response to four second inverted control signals CS2B_1, CS2B_2, CS2B_3, and CS2B_4, respectively.

The fourth half-strength inverter 445 may include an input terminal configured to receive the first supply voltage VDD, another input terminal connected to the first node N1, and an output terminal connected to the fourth node N4.

In the present example embodiment, sizes of the first to fourth half-strength inverters 415, 425, 435, and 445 may be smaller than sizes of the first to fourth inverters 411, 412, 413, 414, 421, 422, 423, 424, 431, 432, 433, 434, 441, 442, 443, and 444.

The first half-strength inverter 415 and the fourth half-strength inverter 445 may be turned on, and the second half-strength inverter 425 and the third half-strength inverter 435 may be turned off. In an example taken with reference to FIG. 4A, the first half-strength inverter 415 and the fourth half-strength inverter 445 may receive the first supply voltage VDD, and the second half-strength inverter 425 and the third half-strength inverter 435 may receive the second supply voltage VSS. In another implementation, the first half-strength inverter 415 and the fourth half-strength inverter 445 may be turned off, and the second half-strength inverter 425 and the third half-strength inverter 435 may be turned on.

A selector 450 may select any one of the first interpolation signal MIDE and the second interpolation signal MIDO in response to a selection signal S, and may output the selected interpolation signal as the internal clock signal ICLK. For example, when the selection signal S is at a first logic level, the selector 450 may select the first interpolation signal MIDE; whereas, when the selection signal S is at a second logic level, the selector 450 may select the second interpolation signal MIDO.

The selector 450 may include a first input terminal connected to the second node N2 and configured to receive the first interpolation signal MIDE, a second input terminal connected to the fourth node N4 and configured to receive the second interpolation signal MIDO, a third input terminal configured to receive the selection signal S, and an output terminal connected to a fifth node N5. The output terminal of the selector 450 may be an inverting output (indicated by a bubble) for inverting the selected interpolation signal. The internal clock signal ICLK may be transmitted to the fifth node N5.

The flip-flop 460 may receive an inverted signal obtained by inverting the selected interpolation signal as a clock input signal (e.g., from the fifth node N5), may receive a third control signal CS3 as a data input signal, and may generate the selection signal S in response to an edge of the inverted signal. The flip-flop 460 may transmit the selection signal S to the selector 450. In an embodiment, a logic level of the selection signal S may be determined according to a logic level of the third control signal CS3 when the inverted signal has a rising edge.

Referring to FIG. 4B, the first interpolation signal MIDE may have odd-numbered phase differences, that is, a first phase difference 'a', a third phase difference 'c', a fifth phase difference 'e', a seventh phase difference 'g', and a ninth phase difference 'i', from among first to tenth phase differences 'a', 'b', 'c', 'e', 'd', 'f', 'g', 'h', 'i', and 'j'. The second interpolation signal MIDO may have even-numbered phase differences, that is, a second phase difference 'b', a fourth phase difference 'd', a sixth phase difference 'f', an eighth phase difference 'h', and a tenth phase difference 'j', from among the first to tenth phase differences 'a', 'b', 'c', 'e', 'd', 'f', 'g', 'h', 'i', and 'j'. The number of delay steps 1 STEP may be 9, and the internal clock signal ICLK may have 10 phase differences to the first internal signal INF.

The phase difference of the first interpolation signal MIDE may be determined according to a logic level of each of the four first control signals CS1_1, CS1_2, CS1_3, and CS1_4.

For example, when the four first control signals CS1_1, CS1_2, CS1_3, and CS1_4 are at the first logic level, the first interpolation signal MIDE may have the first phase difference 'a'. That is, the first interpolation signal MIDE may be an inverted signal of the first internal signal INF. In this case, when the third control signal CS3 has the first logic level, the selected interpolation signal may be the first interpolation signal MIDE.

In another example, when the logic level of the first control signal CS_1 (from among the four first control signals CS1_1, CS1_2, CS1_3, and CS1_4 having the first logic level) is changed from the first logic level to the second logic level, the first interpolation signal MIDE may have the third phase difference 'c'. That is, the first interpolation signal MIDE may be a signal that is delayed by twice a delay step 1 STEP with respect to the inverted signal of the first internal signal INF. In this case, when the third control signal CS3 is at the first logic level, the selected interpolation signal may be the first interpolation signal MIDE.

The phase difference of the second interpolation signal MIDO may be determined according to a logic level of each of the four second control signals CS2_1, CS2_2, CS2_3, and CS2_4.

For instance, when the four second control signals CS2_1, CS2_2, CS2_3, and CS2_4 are at the first logic level, the second interpolation signal MIDO may have the second phase difference 'b'. That is, the second interpolation signal MIDO may be a signal that is delayed by the delay step 1 STEP with respect to the inverted signal of the first internal signal INF. In this case, when the third control signal CS3 is at the second logic level, the selected interpolation signal may be the second interpolation signal MIDO.

In another example, when a logic level of the second control signal CS2_1 (from among the four second control signals CS2_1, CS2_2, CS2_3, and CS2_4 having the first logic level) is changed from the first logic level to the second logic level, the second interpolation signal MIDO may be a signal that is delayed by three times the delay step 1 STEP with respect to the inverted signal of the first internal signal INF. In this case, when the third control signal CS3 is at the second logic level, the selected interpolation signal may be the second interpolation signal MIDO.

As described above, the four first control signals CS1_1, CS1_2, CS1_3, and CS1_4 shown in FIG. 4A may correspond to odd-numbered control signals CS_1, CS_3, CS_5, and CS_7 shown in FIG. 3A, and the four second control signals CS2_1, CS2_2, CS2_3, and CS2_4 shown in FIG. 4A may correspond to even-numbered control signals CS_2, CS_4, CS_6, and CS_8 shown in FIG. 3A. In this case, the first and second control signals CS1 and CS2 may also be expressed as eight bit values. In an example taken with reference to FIGS. 4A and 4B, when the first and second control signals CS1 and CS2 are "00000111," from among the four first control signals CS_1, CS_2, CS_3, and CS_4, the two first control signals (e.g., CS_1 and CS_2) may be at the second logic level, while the remaining two first control signals (e.g., CS1_3 and CS1_4) may be at the first logic level. In addition, from among the four second control signals CS2_1, CS2_2, CS2_3, and CS2_4, one second control signal (e.g., CS2_1) may be at the second logic level, and the three second control signals (e.g., CS2_2, CS2_3, and CS2_4) may be at the first logic level.

During the delay 4 step period DELAY 4 STEP, the third control signal CS3 may be at the first logic level, and the first and second control signals CS1 and CS2 may be "00000111." In this case, because the first interpolation signal MIDE having the fifth phase difference 'e' is selected, the internal clock signal ICLK may have the fifth phase difference 'e' relative to the first internal signal INF.

When the delay 4 step period DELAY 4 STEP is switched to a delay 5 step period DELAY 5 STEP, the control logic circuit 124 may generate first and second control signals CS1 and CS2 expressed as "00001111" such that the internal clock signal ICLK has the sixth phase difference 'f' to the first internal signal INF. In addition, the control logic circuit 124 may change the logic level of the third control signal CS3 from the first logic level to the second logic level after a time point at which the delay 5 step period DELAY 5 STEP is switched. When jitter JT occurs, the second interpolation signal MIDO may temporarily have the fourth phase difference 'd' when the delay 5 step period DELAY 5 STEP starts. However, when the delay 5 step period DELAY 5 STEP starts, the selection signal S may be at the first logic level. Thus, the second interpolation signal MIDO may not be selected, and the second interpolation signal MIDO (of which phase is shifted due to jitter JT) may not be output as the internal clock signal ICLK. Accordingly, the internal clock signal ICLK in which the jitter JT has occurred may not be output.

After the delay 5 step period DELAY 5 STEP starts, the selection signal S may be at the same logic level as the logic level of the third control signal CS3 in response to a rising edge of the internal clock signal ICLK at a third time point t3. For example, when the rising edge of the internal clock signal ICLK occurs at the third time point t3, because the third control signal CS3 is at the second logic level, the selection signal S may be at the second logic level. In this case, because the second interpolation signal MIDO is selected, an inverted signal of the second interpolation signal MIDO may be output as the internal clock signal ICLK after a time point at which the selection signal S is at the second logic level.

As described above, by selectively outputting any one of two interpolation signals according to a delayed extent, jitter of an internal clock signal may be prevented from being transmitted to, e.g., a data I/O buffer, and the reliability of the internal clock signal may be increased.

Furthermore, as described above, jitter of the internal clock signal, which occurs due to a selection signal output by a selector, may be prevented, and thus, the reliability of the internal clock signal may be increased.

Figure 5A:
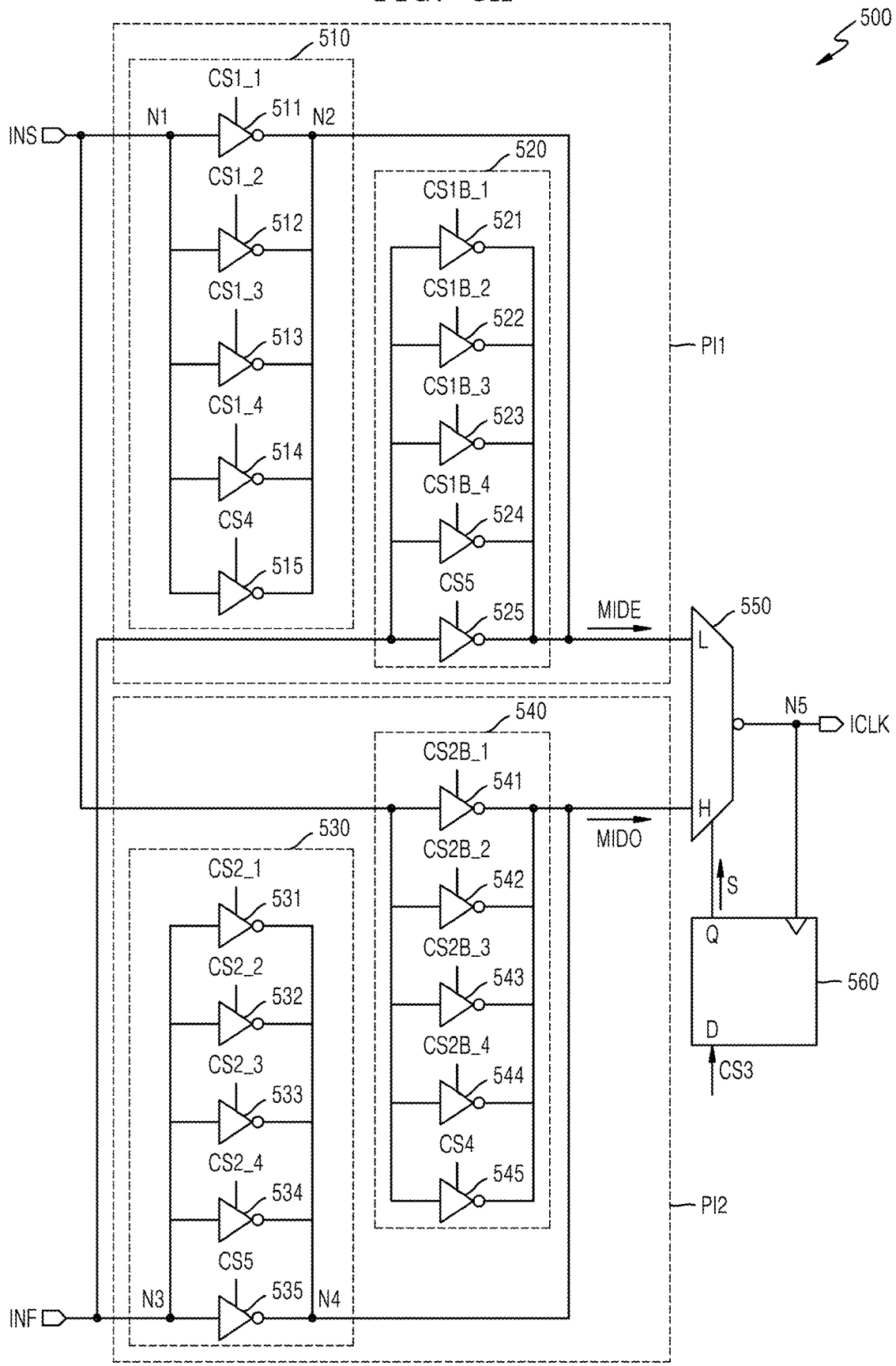
FIGS. 5A and 5B are diagrams of a digital phase interpolator according to an example embodiment.
Figure 5B:
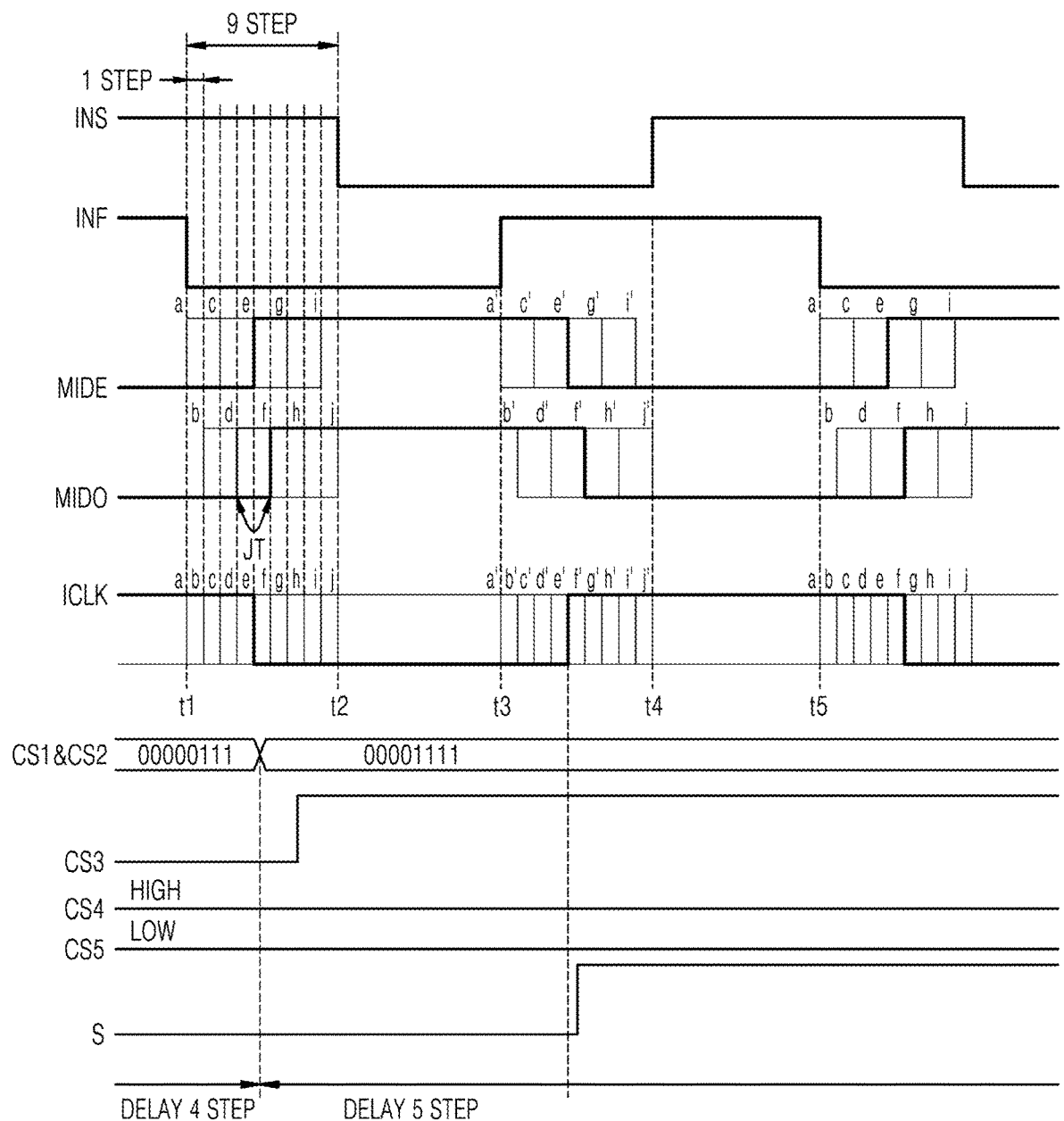

FIGS. 5A and 5B are diagrams of a digital phase interpolator 500 according to an example embodiment. In the following description of the example embodiment shown in FIGS. 5A and 5B, the same description as given with reference to FIGS. 4A and 4B is omitted, and differences are mainly be described.

Referring to FIG. 5A, the digital phase interpolator 500 may include a first phase interpolator PI1, a second phase interpolator PI2, a selector 560, and a flip-flop 570.

The control logic circuit 124 (see FIG. 1) may further generate a fourth control signal CS4 and a fifth control signal CS5. The fourth control signal CS4 and the fifth control signal CS5 may be signals configured to control operations of a half-strength inverter. For example, the fourth control signal CS4 may be applied to a first half-strength inverter 515 included in the first phase interpolator PI1 and a fourth half-strength inverter 545 included in the second phase interpolator PI2. In addition, the fifth control signal CS5 may be applied to a second half-strength inverter 525 included in the first phase interpolator PI1 and a third half-strength inverter 535 included in the second phase interpolator PI2.

The fourth control signal CS4 may be at a second logic level for turning on the half-strength inverter, while the fifth control signal CS5 may be at a first logic level for turning off the half-strength inverter. In another implementation, the fourth control signal CS4 may be at the first logic level, and the fifth control signal CS5 may be at the second logic level. In an example taken with reference to FIG. 5B, the fourth control signal CS4 may be at the second logic level, and the fifth control signal CS5 may be at the first logic level.

Figure 6:
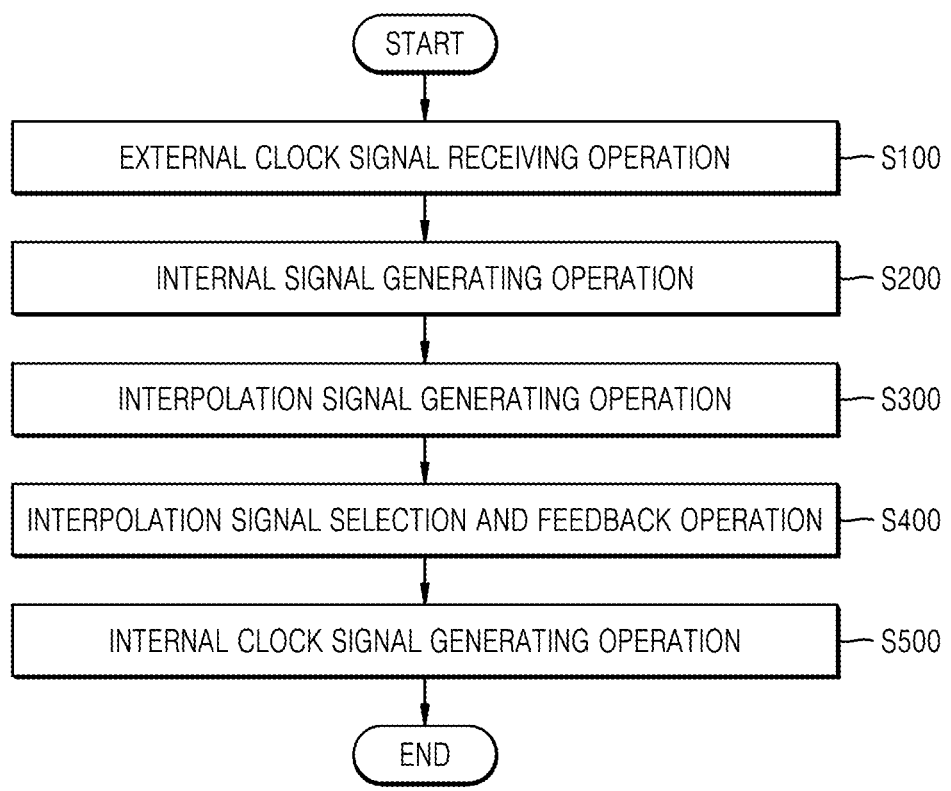
FIG. 6 is a flowchart of a method of operating a clock signal generator, according to an example embodiment.

FIG. 6 is a flowchart of a method of operating the clock signal generator 126, according to an example embodiment.

Referring to FIGS. 1 and 6, in external clock signal receiving operation S100, the clock signal generator 126 may receive the external clock signal CLK.

In internal signal generating operation S200, the clock signal generator 126 may generate the first internal signal INF and the second internal signal INS, based on the external clock signal CLK. A detailed description of the internal signal generating operation S200 may be the same as that provided with reference to FIG. 2.

In interpolation signal generating operation S300, the clock signal generator 126 may interpolate the first internal signal INF with the second internal signal INS, based on the clock control signal CCS, and generate the first interpolation signal MIDE and the second interpolation signal MIDO. A detailed description of the interpolation signal generating operation S300 may be the same as that provided with reference to FIGS. 4A and 4B.

In interpolation signal selection and feedback operation S400, the clock signal generator 126 may select any one interpolation signal from the first interpolation signal MIDE and the second interpolation signal MIDO in response to the selection signal S, and provide the selected interpolation signal as a clock input signal by feedback to a flip-flop. A detailed description of the interpolation signal selection and feedback operation S400 may be the same as that provided with reference to FIGS. 4A and 4B.

In internal clock signal generating operation S500, the clock signal generator 126 may output an inverted signal of the selected interpolation signal as the internal clock signal ICLK. A detailed description of the internal clock signal generating operation S500 may be the same as that provided with reference to FIGS. 4A and 4B.

Figure 7:
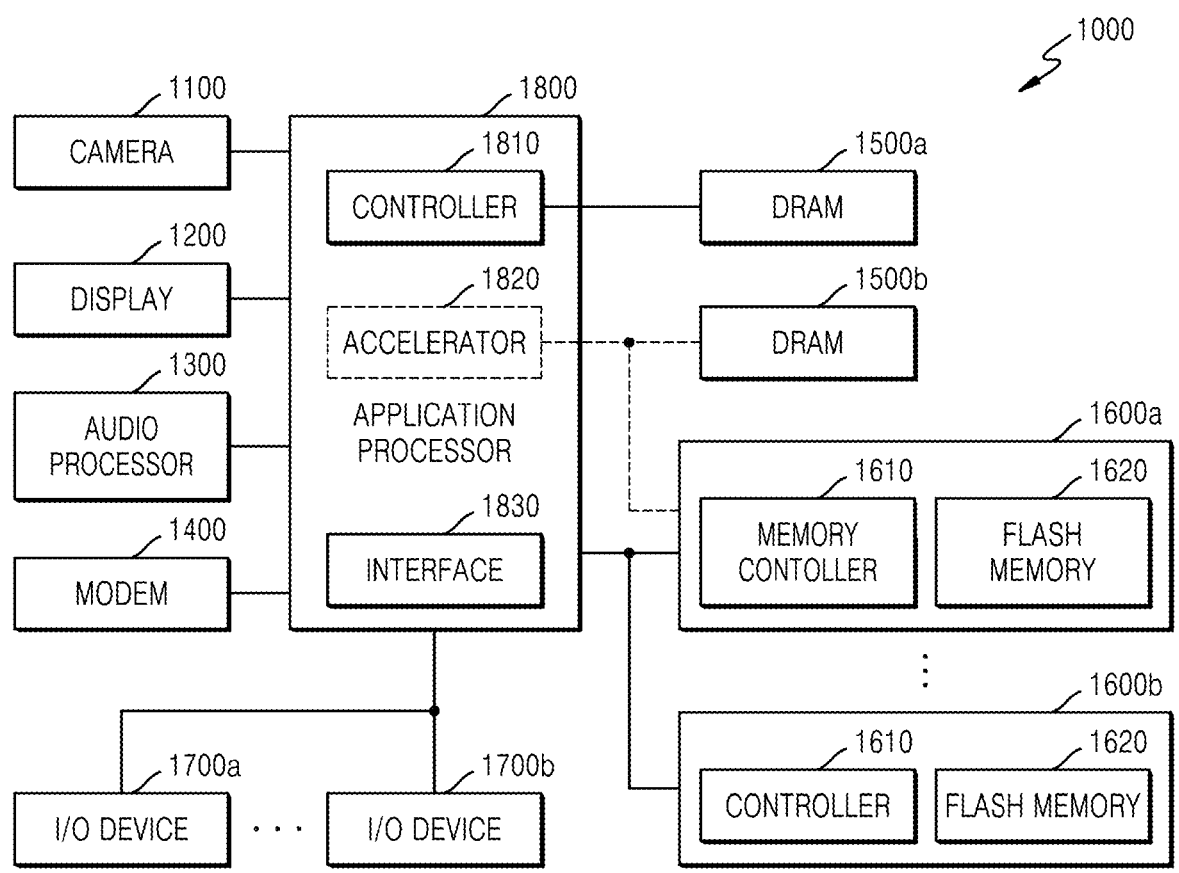
FIG. 7 is a block diagram of a system to which a volatile memory device is applied, according to an example embodiment.

FIG. 7 is a block diagram of a system 1000 to which a volatile memory device is applied, according to an example embodiment.

Referring to FIG. 7, the system 1000 may include a camera 1100, a display 1200, an audio processor 1300, a modem 1400, DRAMs 1500a and 1500b, flash memory devices 1600a and 1600b, I/O devices 1700a and 1700b, and an application processor (AP) 1800. The system 1000 may be implemented as a laptop computer, a mobile phone, a smartphone, a tablet personal computer (PC), a wearable device, a healthcare device, or an Internet of Things (IoT) device. In addition, the system 1000 may be implemented as a server or a personal computer.

The camera 1100 may capture a still image or a moving image via the user's control, and may store the captured image and image data or transmit the captured image and the image data to the display 1200.

The audio processor 1300 may process audio data, e.g., audio data included in content of the flash memory devices 1600a and 1600b or a network.

To transmit and receive wired/wireless data, the modem 1400 may modulate and transmit a signal, and may demodulate a modulated signal to restore the modulated signal to an original signal at a receiving side.

The I/O devices 1700a and 1700b may include devices configured to provide digital input and/or output functions, such as a universal serial bus (USB), a storage, a digital camera, a secure digital (SD) card, a digital versatile disc (DVD), a network adaptor, and a touch screen.

The AP 1800 may control all operations of the system 1000. The AP 1800 may control the display 1200 such that some of the content stored in the flash memory devices 1600a and 1600b is displayed on the display 1200. The AP 1800 may perform a control operation corresponding to a user's input when the AP 1800 receives the user's input through the I/O devices 1700a and 1700b. The AP 1800 may include an accelerator block 1820, which is a dedicated circuit for an artificial intelligence (AI) data operation, or an accelerator chip may be provided separately from the AP 1800. The DRAM 1500b may be further mounted in the accelerator block 1820. The accelerator block 1820 may be a dedicated function block for a specific function of the AP 1800 and include a graphics processing unit (GPU), a neural processing unit (NPU), and a data processing unit (DPU). The GPU may be a dedicated function block configured to process graphics data, the NPU may be a dedicated block configured to perform AI calculations and inference, and the DPU may be a dedicated block configured to transmit data.

The system 1000 may include a plurality of DRAMs (e.g., 1500a and 1500b) and a controller 1810 configured to the DRAMs 1500a and 1500b. The AP 1800 may control the DRAMs 1500a and 1500b by using commands and mode register set (MRS) signals that conform to the JEDEC standard, or may communicate with the DRAMs 1500a and 1500b by setting a DRAM interface protocol to use enterprise-specific functions (e.g., low voltage/high speed/reliability) and cyclic redundancy check (CRC)/error correction code (ECC) functions. For example, the AP 1800 may communicate with the DRAM 1500a via an interface (e.g., LPDDR4 and LPDDR5) that conforms to the JEDEC standard. To control the DRAM 1500b for an accelerator, which has a higher bandwidth than the DRAM 1500a, the accelerator block 1820 may communicate with the DRAM 1500b by setting a new DRAM interface protocol.

Although only the DRAMs 1500a and 1500b are illustrated in FIG. 7, any suitable memory, such as phase-change RAM (PRAM), static RAM (SRAM), magnetic RAM (MRAM), resistive RAM (RRAM), ferroelectric RAM (FRAM), or hybrid RAM, may be used that satisfies the bandwidth, reaction rate, and voltage requirements for the AP 1800 or the accelerator block 1820. The DRAMs 1500a and 1500b may have less latency and bandwidths than the I/O devices 1700a and 1700b or the flash memory devices 1600a and 1600b. Each of the DRAMs 1500a and 1500b may be initialized at the time when the system 1000 is powered on. The DRAMs 1500a and 1500b may be used as temporary storages in which an operating system and application data are loaded, or used as execution spaces for various software code. Each of the DRAMs 1500a and 1500b may be the volatile memory device 100 described above.

Addition/subtraction/multiplication/division operations, vector operations, address operations, or fast Fourier Transform (FFT) operations may be performed using the DRAMs 1500a and 1500b. In addition, a function used for inference may be performed using the DRAMs 1500a and 1500b. Here, the inference may be performed in a deep learning algorithm using an artificial neural network. The deep learning algorithm may include a training operation of training a model using various pieces of data and an inference operation of recognizing data based on the trained model. In an example embodiment, an image captured by the user through the camera 1100 may be signal-processed and stored in the DRAM 1500b. The accelerator block (or accelerator chip) 1820 may perform an AI data operation for recognizing data by using data stored in the DRAM 1500b and a function used for inference.

The system 1000 may include a plurality of storages or a plurality of flash memory devices (e.g., 1600a and 1600b), which may have a larger capacity than the DRAMs 1500a and 1500b. The accelerator block (or accelerator chip) 1820 may perform a training operation and an AI data operation by using the flash memory devices 1600a and 1600b. In an example embodiment, the flash memory devices 1600a and 1600b may efficiently perform the training operation which the AP 1800 and/or the accelerator block 1820 perform and an inference AI data operation, by using a computing device included in a memory controller 1610. Each of the flash memory devices 1600a and 1600b may store an image captured by the camera 1100 or store received through a data network. For example, each of the flash memory devices 1600a and 1600b may store augmented reality/virtual reality content and/or high definition (HD) or ultra-high definition (UHD) content.

By way of summation and review, a digital phase interpolator may be used to adjust a delay time of an internal clock signal. The digital phase interpolator may receive two input signals, interpolate the two input signals with each other, and generate an interpolation signal having a specific phase between phases of the two input signals. The digital phase interpolator may be implemented as a simple circuit and precisely output a desired phase. Thus, the digital phase interpolator may be used in various application circuits, such as a semi-digital delay locked loop (DLL).

As described above, embodiments may provide a digital phase interpolator configured to selectively output one of two interpolation signals depending on a delay set value, a clock signal generator, and a volatile memory device including the clock signal generator.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A clock signal generator configured to receive an external clock signal and to generate an internal clock signal, the clock signal generator comprising:
   an internal signal generator configured to generate a first internal signal and a second internal signal, based on the external clock signal, the first internal signal having a predetermined phase difference relative to the second internal signal;
   a first phase interpolator configured to interpolate the first internal signal with the second internal signal in response to a first control signal, and to generate a first interpolation signal that is delayed by 2N times a preset delay step with respect to the first internal signal, wherein N is an integer greater than or equal to 0;
   a second phase interpolator configured to interpolate the first internal signal with the second internal signal in response to a second control signal, and to generate a second interpolation signal that is delayed by (2N+1) times the preset delay step with respect to the first internal signal; and
   a selector configured to select any one of the first interpolation signal and the second interpolation signal in response to a selection signal, and to output the selected interpolation signal as the internal clock signal.

2. The clock signal generator as claimed in claim 1, wherein the first phase interpolator includes:
a first inverter configured to invert the second internal signal in response to the first control signal;
a first half-strength inverter connected in parallel to the first inverter and configured to receive the second internal signal;
a second inverter configured to invert the first internal signal in response to a first inverted control signal obtained by inverting the first control signal; and
a second half-strength inverter connected in parallel to the second inverter and configured to receive the first internal signal,
wherein, when one of the first half-strength inverter and the second half-strength inverter is turned on, the other one of the first half-strength inverter and the second half-strength inverter is turned off.

3. The clock signal generator as claimed in claim 2, wherein the second phase interpolator includes:
a third inverter configured to invert the first internal signal in response to the second control signal;
a third half-strength inverter connected in parallel to the third inverter and configured to receive the first internal signal;
a fourth inverter configured to invert the second internal signal in response to a second inverted control signal obtained by inverting the second control signal; and
a fourth half-strength inverter connected in parallel to the fourth inverter and configured to receive the second internal signal,
wherein, when the first half-strength inverter and the fourth half-strength inverter are turned on, the second half-strength inverter and the third half-strength inverter are turned off, or when the first half-strength inverter and the fourth half-strength inverter are turned off, the second half-strength inverter and the third half-strength inverter are turned on.

4. The clock signal generator as claimed in claim 3, further comprising a flip-flop configured to receive an inverted signal obtained by inverting the selected interpolation signal, as a clock input signal, to receive a third control signal as a data input signal, and to generate the selection signal in response to an edge of the inverted signal.

5. The clock signal generator as claimed in claim 4, wherein, when the third control signal is at a first logic level and the first control signal is at the first logic level, the selected interpolation signal is the first interpolation signal, and the first interpolation signal is an inverted signal of the first internal signal.

6. The clock signal generator as claimed in claim 5, wherein, when a logic level of the first control signal is changed from the first logic level to a second logic level, the first interpolation signal is a signal that is delayed by twice the preset delay step with respect to the inverted signal of the first internal signal.

7. The clock signal generator as claimed in claim 4, wherein, when the third control signal is at a second logic level and the second control signal is at a first logic level, the selected interpolation signal is the second interpolation signal, and the second interpolation signal is a signal that is delayed by the preset delay step with respect to the inverted signal of the first internal signal.

8. The clock signal generator as claimed in claim 7, wherein, when a logic level of the second control signal is changed from the first logic level to the second logic level, the second interpolation signal is a signal that is delayed by three times the preset delay step with respect to the inverted signal of the first internal signal.

9. A digital phase interpolator configured to receive a first internal signal and a second internal signal, and to generate an internal clock signal, the digital phase interpolator comprising:
a first phase interpolator including a first inverter group and a second inverter group, the first inverter group being connected between a first node to which the second internal signal is applied and a second node, the second inverter group being connected between a third node to which the first internal signal is applied and the second node;
a second phase interpolator including a third inverter group and a fourth inverter group, the third inverter group being connected between the third node and a fourth node, the fourth inverter group being connected between the first node and the fourth node;
a selector including a first input terminal connected to the second node, a second input terminal connected to the fourth node, a third input terminal to which a selection signal is applied, and an output terminal connected to a fifth node to which the internal clock signal is transmitted; and
a flip-flop including a data input terminal, a clock input terminal connected to the fifth node, and an output terminal configured to output the selection signal,
wherein each of the first to fourth inverter groups includes at least one inverter and a half-strength inverter having a smaller size than the at least one inverter.

10. The digital phase interpolator as claimed in claim 9, wherein:
the first inverter group includes a first inverter connected between the first node and the second node, and a first half-strength inverter connected in parallel to the first inverter, and
the second inverter group includes a second inverter connected between the third node and the second node, and a second half-strength inverter connected in parallel to the second inverter.

11. The digital phase interpolator as claimed in claim 10, wherein:
the third inverter group includes a third inverter connected between the third node and the fourth node, and a third half-strength inverter connected in parallel to the third inverter, and
the fourth inverter group includes a fourth inverter connected between the first node and the fourth node, and a fourth half-strength inverter connected in parallel to the fourth inverter.

12. The digital phase interpolator as claimed in claim 11, wherein:
the digital phase interpolator is further configured to receive first to third control signals, a first supply voltage, and a second supply voltage having a lower voltage level than the first supply voltage,
the first inverter includes an input terminal configured to receive the first control signal from among the first to third control signals,
the second inverter includes an input terminal configured to receive an inverted signal of the first control signal,
the third inverter includes an input terminal configured to receive the second control signal from among the first to third control signals,
the fourth inverter includes an input terminal configured to receive an inverted signal of the second control signal, the first half-strength inverter and the fourth half-strength inverter include input terminals configured to receive the first supply voltage, the second half-strength inverter and the third half-strength inverter include input terminals configured to receive the second supply voltage, and the third control signal is received by the data input terminal of the flip-flop.

13. The digital phase interpolator as claimed in claim 11, wherein:

the digital phase interpolator is further configured to receive first to fifth control signals, the first inverter includes an input terminal configured to receive the first control signal, from among the first to fifth control signals, the second inverter includes an input terminal configured to receive an inverted signal of the first control signal, the third inverter includes an input terminal configured to receive the second control signal, from among the first to fifth control signals, the fourth inverter includes an input terminal configured to receive an inverted signal of the second control signal, each of the first half-strength inverter and the fourth half-strength inverter includes an input terminal configured to receive the fourth control signal, from among the first to fifth control signals, and each of the second half-strength inverter and the third half-strength inverter includes an input terminal configured to receive the fifth control signal, from among the first to fifth control signals.

14. A volatile memory device, comprising:

a memory cell array including a plurality of memory cells;

a clock signal generator configured to receive an external clock signal and generate an internal clock signal;

a data input/output circuit configured to transmit data sensed from the memory cell array in response to the internal clock signal; and a control logic circuit configured to output first to third control signals to the clock signal generator, wherein the clock signal generator includes:

an internal signal generator configured to generate a first internal signal and a second internal signal, based on the external clock signal, the first internal signal having a predetermined phase difference relative to the second internal signal;

a first phase interpolator configured to interpolate the first internal signal with the second internal signal in response to the first control signal, from among the first to third control signals, and to generate a first interpolation signal;

a second phase interpolator configured to interpolate the first internal signal with the second internal signal in response to the second control signal, from among the first to third control signals, and to generate a second interpolation signal;

a selector configured to select any one of the first interpolation signal and the second interpolation signal in response to a selection signal, and to output the selected interpolation signal as the internal clock signal; and a flip-flop configured to receive an inverted signal obtained by inverting the selected interpolation signal, as a clock input signal, to receive the third control signal from among the first to third control signals, as a data input signal, and to generate the selection signal in response to an edge of the inverted signal.

15. The volatile memory device as claimed in claim 14, wherein the first phase interpolator includes:

a first inverter configured to invert the second internal signal in response to the first control signal;

a first half-strength inverter connected in parallel to the first inverter, and configured to receive the second internal signal;

a second inverter configured to invert the first internal signal in response to a first inverted control signal obtained by inverting the first control signal; and a second half-strength inverter connected in parallel to the second inverter, and configured to receive the first internal signal, wherein, when one of the first half-strength inverter and the second half-strength inverter is turned on, and the other one of the first half-strength inverter and the second half-strength inverter is turned off.

16. The volatile memory device as claimed in claim 15, wherein the second phase interpolator includes:

a third inverter configured to invert the first internal signal in response to the second control signal;

a third half-strength inverter connected in parallel to the third inverter, and configured to receive the first internal signal;

a fourth inverter configured to invert the second internal signal in response to a second inverted control signal obtained by inverting the second control signal; and a fourth half-strength inverter connected in parallel to the fourth inverter, and configured to receive the second internal signal, wherein, when the first half-strength inverter and the fourth half-strength inverter are turned on, the second half-strength inverter and the third half-strength inverter are turned off, or, when the first half-strength inverter and the fourth half-strength inverter are turned off, the second half-strength inverter and the third half-strength inverter are turned on.

17. The volatile memory device as claimed in claim 16, wherein, when the third control signal is at a first logic level and the first control signal is at the first logic level, the selected interpolation signal is the first interpolation signal, and the first interpolation signal is an inverted signal of the first internal signal.

18. The volatile memory device as claimed in claim 17, wherein, when a logic level of the first control signal is changed from the first logic level to a second logic level, the first interpolation signal is a signal that is delayed by twice a preset delay step with respect to the inverted signal of the first internal signal.

19. The volatile memory device as claimed in claim 16, wherein, when the third control signal is at a second logic level and the second control signal is a first logic level, the selected interpolation signal is the second interpolation signal, and the second interpolation signal is a signal that is delayed by a preset delay step with respect to the inverted signal of the first internal signal.

20. The volatile memory device as claimed in claim 19, wherein, when a logic level of the second control signal is changed from the first logic level to the second logic level, the second interpolation signal is a signal that is delayed by three times the preset delay step with respect to the inverted signal of the first internal signal.

* * * * *